(12) United States Patent
Jensen et al.

(10) Patent No.: US 7,362,850 B2
(45) Date of Patent: Apr. 22, 2008

(54) METHOD AND ARRANGEMENT FOR ESTIMATION OF LINE PROPERTIES

(75) Inventors: Axel Frank Jensen, Fredensborg (DK); Fredrik Lindqvist, Älvsjö (SE); Adam Wiå, Haninge (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 355 days.

(21) Appl. No.: 10/556,657

(22) PCT Filed: May 11, 2004

(86) PCT No.: PCT/SE2004/000718

§ 371 (c)(1),
(2), (4) Date: Nov. 12, 2005

(87) PCT Pub. No.: WO2004/099711

PCT Pub. Date: Nov. 18, 2004

(65) Prior Publication Data

US 2007/0014393 A1      Jan. 18, 2007

(51) Int. Cl.
H04M 1/24      (2006.01)
H04M 3/08      (2006.01)
H04M 3/22      (2006.01)

(52) U.S. Cl. ............... 379/1.03; 379/1.01; 379/30; 379/23; 379/24

(58) Field of Classification Search ............ 379/1.01, 379/1.03, 1.04, 15.05, 22, 22.01, 22.02, 22.03, 379/22.08, 23, 24, 25, 27.01, 28, 29.01, 29.03, 379/29.04, 30; 324/500, 512, 519, 520, 525, 324/532, 534
See application file for complete search history.

(56) References Cited

U.S. PATENT DOCUMENTS 6,084,946 A      7/2000   Beierle 6,819,744 B1*    11/2004  Banwell et al. ............ 379/1.01
2003/0002658 A1*  1/2003  Belge et al. ............... 379/22.01
2004/0189317 A1*  9/2004  Borchert et al. ............ 324/512

FOREIGN PATENT DOCUMENTS

| EP | 0583230 A1 | 2/1994 |
| GB | 662707 A | 12/1951 |
| WO | WO 02068968 A2 | 9/2002 |
| WO | WO 03026160 A2 | 3/2003 |

* cited by examiner

*Primary Examiner*—Quoc Tran (57) ABSTRACT

The length and attenuation of a signal line between a transmitter and a customer premises equipment is to be estimated. A frequency dependent line input impedance ($Z_{in}(f)$) as seen from the transmitter, is measured and an absolute impedance value (œ $Z_{in}(f)$ œ) is generated. The latter is shown as a curve (A1) in the diagram with the frequency (f) on the abscissa and the impedance (œ $Z_{in}(f)$ œ) on the ordinate. Extreme values (Max.1, Max2, Max3; Min1, Min2, Min3) arc denoted and a frequency distance (FD1-FD4) between two consecutive of the extreme values is generated. The line length (L) is generated as L=½·vop/FD1, in which vop is the velocity of propagation of a signal on the line. The attenuation is estimated by multiplying the line length with an average attenuation value for the actual line type. The advantages are that the line length can be estimated with good accuracy in a simple manner for short lines and that the line attenuation is estimated in a simple manner.

12 Claims, 7 Drawing Sheets

FIG. 9

METHOD AND ARRANGEMENT FOR ESTIMATION OF LINE PROPERTIES

TECHNICAL FIELD OF THE INVENTION

The present invention relates to a method and an arrangement in the area of estimation of line properties of a signal line, such as the line length and line attenuation.

DESCRIPTION OF RELATED ART

In today's telecommunication it is essential from an economical point of view to use existing copper wires for broadband transmission. These copper wires, often called twisted-pair copper loops or copper access lines, have among themselves very different properties from a broadband point of view. Telecom operators therefore have a great interest in testing the properties of the lines to be able to fully utilize their transmission capacity. The above-mentioned is discussed in an article by Walter Goralski: "XDSL Loop Qualification and Testing", IEEE Communications Magazine, May 1999, pages 79-83. The article also discusses testing possibilities and test equipment.

The transmission properties of copper lines are more closely discussed in an article by José E. Schutt-Ainé: "High-Frequency Characterization of Twisted-Pair Cables", IEEE Transactions on Communications, Vol. 49, No. 4, April 2001. Propagation parameters of high bit rate digital subscriber twisted-pair cables are extracted by a wave propagation method model. The frequency dependence in the properties of the transmission line and the influence of the skin effect on these are studied.

Testing the transmission properties of a line can be performed by sending a test signal from one end of the line and measure it at the other end, so called double end test. That method is labour intensive and expensive. A more frequently used method is to send a test signal from one end of the line and measure on the reflected signal from the line, so called Single-Ended Loop Testing, SELT. In an article by Stefano Galli and David L Waring: "Loop Makeup Identification Via Single Ended Testing: Beyond Mere Loop Qualification", IEEE Journal on Selected Areas in Communications, Vol. 20, No. 5, June 2002 is discussed the influence of different types of line discontinuities and generated echoes in connection with single-ended testing. Especially time-domain reflectometry, TDR, is discussed for measuring the length of a line. An outgoing pulse is sent to the line and a reflected pulse is detected. Assuming that the velocity of the pulse is known, then by measuring the time between the two pulses the line length can be estimated. One difficulty with the traditional TDR method is that the reflected pulse can be heavily attenuated and be difficult to detect, as it is hidden by the rather broad outgoing pulse. To avoid this problem the pulses can be filtered, but the Galli and Waring article suggests to instead subtract the outgoing pulse to get a distinct reflected pulse. A mathematical method for handling the echoes is presented and also an experimental validation of the method.

Another problem with the traditional TDR method is that for short lines the outgoing and reflected pulses are close to each other and are difficult to separate of that reason. For a very long line, on the other hand, the reflected pulse is heavily attenuated and can be hidden in the noise. Therefore, in traditional TDR, for some measurements only one pulse is observable and it is impossible to know if it depends on that the line is very short or very long.

In single-ended testing it is advantageous to use the transceiver as a part of a mesurement device for the loop under test. The broadband communication transceiver is no perfect voltage generator but introduces distortion in the measurement. How to remove this distortion is discussed in a standardization paper by Thierry Pollet: "How is G.selt to specify $S_{11}$ (calibrated measurements)?", ITU Telecommunication Standardization Sector, Temporary Document OJ-091; Osaka, Japan 21-25 Oct., 2002. A calibration method is presented, based on a one port scattering parameter $S_{11}$, that includes transceiver parameters which are generated during a calibration. Also in a standardization paper by Thierry Pollet: "Minimal information to be passed between measurement and interpretation unit", ITU Telecommunication Standardization Sector, Temporary Document OC-049; Ottawa, Canada 5-9 Aug., 2002, the one port scattering parameter $S_{11}$ is discussed.

SUMMARY OF THE INVENTION

The present invention is concerned with a main problem how to estimate the length of a signal line.

Another problem is how to classify the line as being a long or a short line, prior to the length estimation.

Still a problem is how to perform the length estimation in a single ended loop test, utilizing a transceiver intended for communication purposes.

A further problem is to estimate a line attenuation.

The problems are solved by generation of an absolute value of a frequency dependent line input impedance and utilizing the waveform and periodicity of the absolute value of the line input impedance.

More closely the problems are solved by selecting consecutive maxima or consecutive minima of the absolute value of the line input impedance. A frequency distance between two of the consecutive extreme values is determined. With the aid of the signal velocity of propagation on the line and the frequency distance the line length is estimated. An attenuation value is in one embodiment generated based on the length and an attenuation per length unit for the line. In an Talternative embodiment extreme values of the absolute impedance value curve are used to estimate the line attenuation.

A purpose with the invention is to estimate the length of the signal line in a simple manner.

Another purpose is to classify the line as long or short before the length estimation.

Still a purpose is to facilitate the use of a transceiver for communication purposes in the line length estimation.

Still another purpose is to make the length estimation independent of the hardware in the transceiver.

A further purpose is to estimate a line attenuation.

An advantage with the invention is that the line can be decided as short before the length estimation.

Another advantage is that a reliable length value can be estimated for short lines.

Still an advantage is that a transceiver for communication purposes can be calibrated and used for the estimation.

Still another advantage is to make the length estimation independent of the hardware in the transceiver.

A further advantage is that the line attenuation can be generated in a simple manner.

The invention will now be more closely described with the aid of embodiments and with refernce to the enclosed drawings.

DETAILED DESCRIPTION OF EMBODIMENTS

Figure 1:
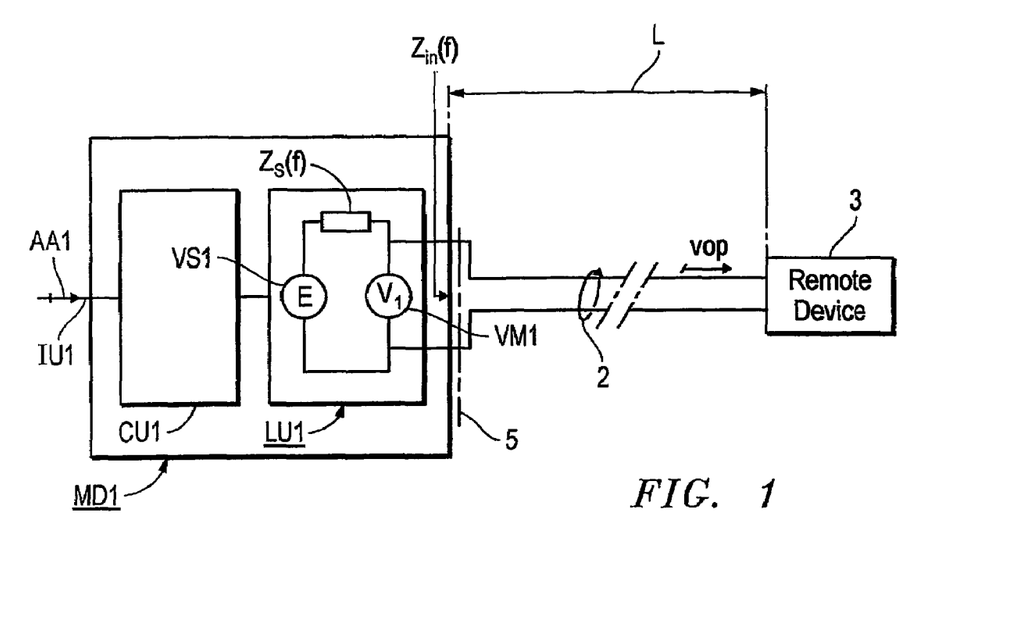
FIG. 1 shows a block schematic over measurement device connected to a line.

In FIG. 1 is shown a front end device, a measurement device MD1, connected to a customer's remote device 3 via a signal line 2 having a length L. This signal line is a copper wire initially used for narrowband signal transmission. A signal on the line 2 propagates with a velocity vop·m/s. As mentioned above it is of great interest for telecommunication operators to use such lines for brodband transmission and therefore the properties of the line 2 must be known, such as the line length L. The properties of the line are therefore to be measured, which can be performed by different methods.

One such method is shown in FIG. 1. The measurement device MD1 has a line unit LU1 and a calculation unit CU1 connected to each other. The measuring device MD1 has a control input/output IU1. The line unit has a frequency broadband voltage source VS1 with a voltage E and an impedance $Z_s$ and also a voltage measurement device VM1 measuring a line input voltage $V_1$. A frequency dependent line input impedance $(Z_{in}(f))$ for a loop including the line 2 and the remote device 3 can be calculated by an equation $$V_1 = \frac{Z_{in}}{Z_{in} + Z_S} E \qquad (1)$$

The calculation is performed in the calculation unit CU1.

Figure 2:
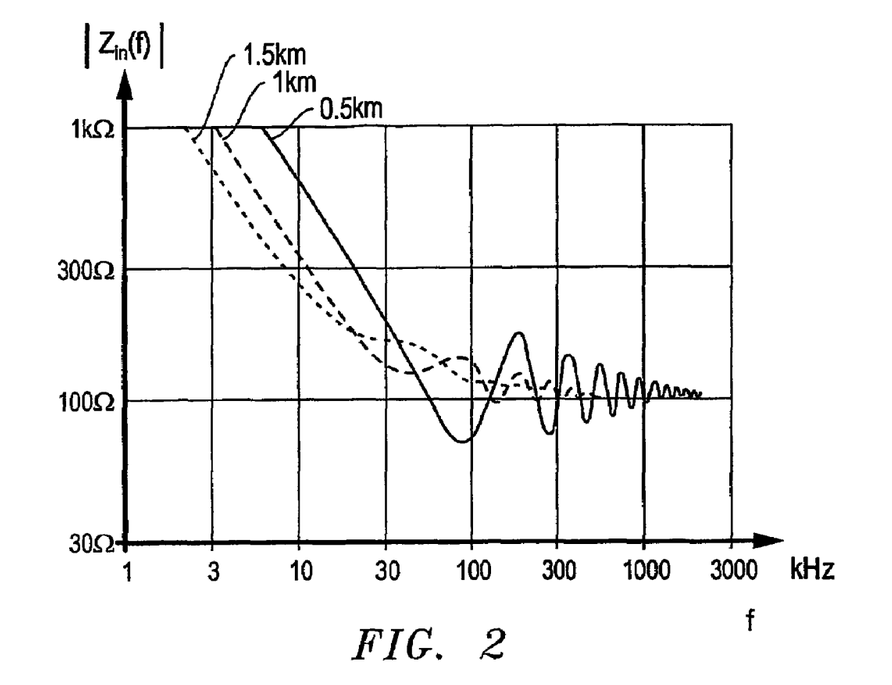
FIG. 2 shows a diagram with line impedance for different lines.

In the present invention the frequency dependent line input impedance $Z_{in}(f)$ is used to generate an estimated value of the line length L. It is observed that the impedance $Z_{in}(f)$ is a function that has a part that is periodic with the frequency as is shown in FIG. 2. This figure is a diagram with the frequency f on the abscissa and an absolute value $|Z_{in}(f)|$ of the line input impedance on the ordinate. The diagram shows curves over measurements of the absolute value $|Z_{in}(f)|$ of the input impedance $Z_{in}(f)$ for different lengths of the signal line 2. The signal line is a cable of certain type and the remote device 3 is in the embodiment a telephone set in the on-hook state. The cable lengths, denoted in kilometers the diagram, are 0.5 km, 1.0 km and 1.5 km. It appears from the diagram that the period for the respective curve is different for the different cable lengths.

Figure 3:
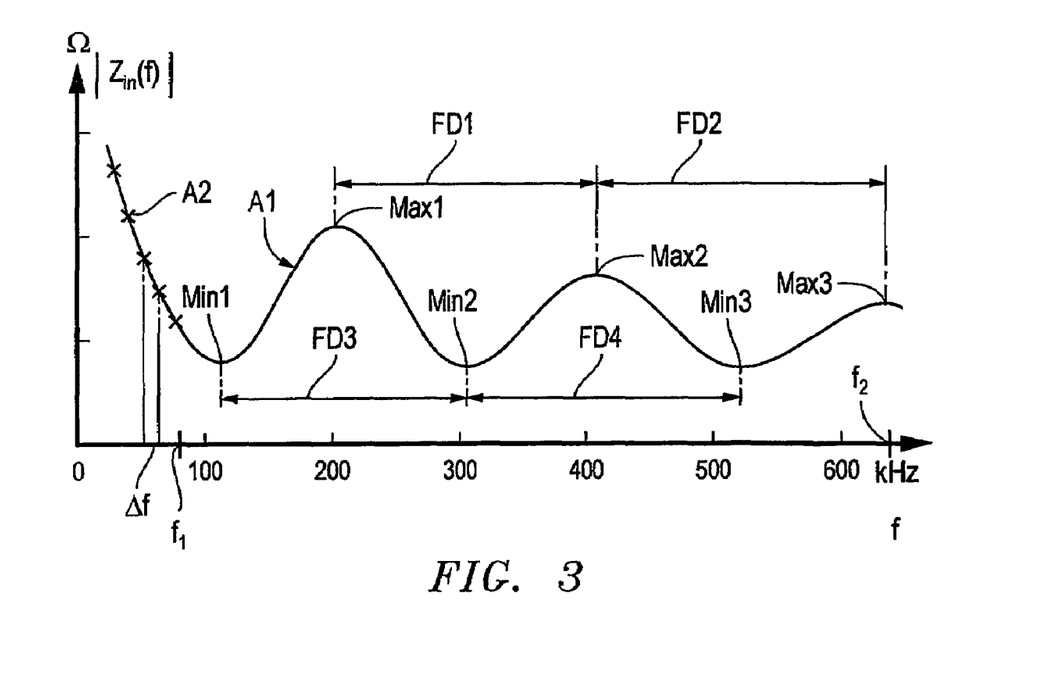
FIG. 3 shows a diagram with line impedance for one line.

In FIG. 3 is shown an impedance diagram for only one signal line having the length L. The diagram has the frequency f on the abscissa and the absolute value $|Z_{in}(f)|$ of the line input impedance on the ordinate. In this diagram is shown an impedance curve A1 which is essentially periodic and is generated by a number of samples A2 at mutual frequency distance of Δf. The curve A1 has a number of extreme values of which maximums Max1, Max2, Max3 and minimums Min1, Min2, Min3 are shown. The frequency distance between two consecutive of the extreme values of the same type is denoted by FD1, FD2, FD3 and FD4 respectively. The line length L can now be estimated by using the distance FD1 and with the aid of the velocity of propagation vop by an equation:

$$L = \tfrac{1}{2} vop/FD1 \qquad (2)$$

This equation can alternatively be expressed as $$L = \frac{1}{2} \frac{vop}{cycle \cdot \Delta f} \qquad (3)$$

In the equation (3) the expression cycle is the "cycle time", i.e. the periodicity, of the input impedance $|Z_{in}(f)|$ expressed in number of the samples A2 between two consecutive maximums or minimums of the curve A1.

The velocity of propagation vop is about 0.7 of the velocity of light in vaccum, i.e vop≈2·10⁸ m/s. In the example in FIG. 3 the frequency distance is FD1≈200 kHz. The line length can be estimated by the equation 2 to about L=500 m.

The length estimation of the line 2 can be improved by using more than one of the frequency distances. As mentioned above the curve A1 is essentially periodic. It has however been observed that, in some cases depending on the type of termination, the frequency distance FD2 is slightly longer than the distance FD1 and correspondingly the distance FD4 is slightly longer than the distance FD3. For higher frequencies the frequency distances successively grows still a little bit. This fact depends on that, in the actual cases, the velocity of propagation vop increases with increasing frequency. Mean values MV1 and MV2 can be generated for the frequency distance by e.g. the equations $$MV1=(FD1+FD2)/2 \qquad (4)$$

$$MV2=(FD3+FD4)/2 \qquad (5)$$

The line length L is estimated as $$L=\tfrac{1}{2} vop/MV1 \qquad (6)$$

$$L=\tfrac{1}{2} vop/MV2 \qquad (7)$$

Still an improvement is to use both the maximums and the minimums e.g. by generating a mean frequency distance $$MV3=(MV1+MV2)/2 \qquad (8)$$

and estimate the line length as $$L=\tfrac{1}{2} vop/MV3 \qquad (9)$$

In the above examples the frequency distances between three maximums or minimums have been used. In an obvious way it is possible to use still further of the extreme values of the curve A1 to generate the length estimate L of the line 2. The type of averaging depends on the type of termination of the line, i.e. the type of the remote device 3. If the termination is known in a certain case it is possible to choose the most appropriate averaging.

As appears from FIG. 2 the amplitude oscillation in the signal $|Z_{in}(f)|$ is larger for a short than for a long loop. This means that the estimated length value L will be less exact for a long loop. It is therefore of interest to estimate if a loop can be regarded as short. Below is disclosed how the input impedance, $Z_{in}(f)$, can be used for this purpose, short loop detection. The basic principle is to calculate a decision value dValue and compare it with a threshold value thValue, which threshold value should cover realistic telecommunication cables. The threshold value depends on the different attenuation for the different types of cables. A decision value can be calculated as follows:

$$mValue = \frac{1}{f_2 - f_1} \sum_{f=f_1}^{f_2} |Z_{in}(f)| \tag{10}$$

where $f_1$ and $f_2$ are design parameters that represent the lowest and highest frequency to consider. The mValue is a mean value of the curve A1 in the actual frequency range.

$$dValue = \sum_{f=f_1}^{f_2} |(|Z_{in}(f)| - mValue)| \tag{11}$$

The dValue corresponds to an energy value for the fluctuations of the curve A1 in the actual frequency range. If the dValue$\geq$thValue the loop should be considered as short. The value thValue is a design parameter that sets the limit for when a loop shall be considered short.

Figure 4:
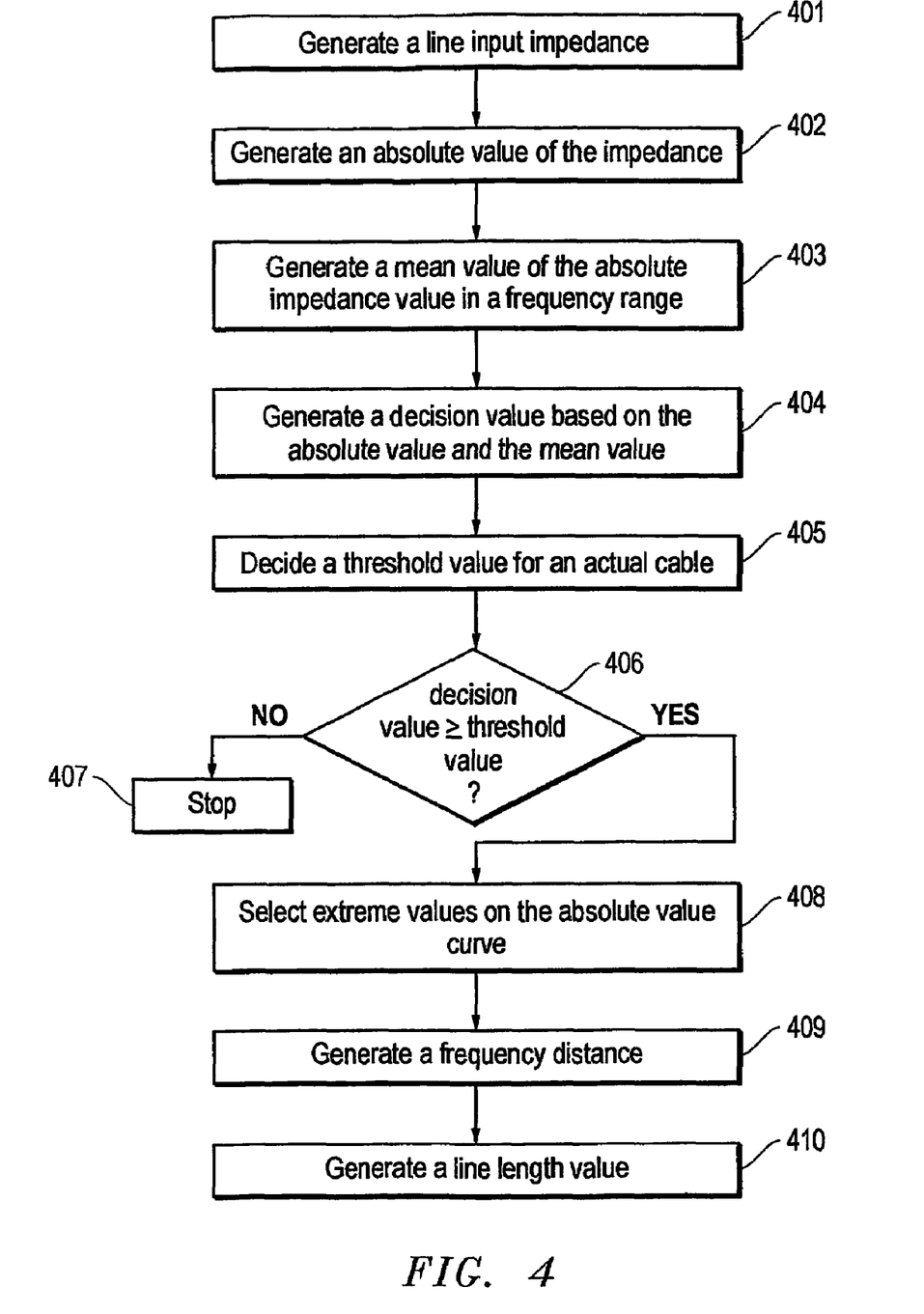
FIG. 4 shows a flow chart over a method of line length estimation.

The decision of short loop length and generation of the length for the signal line 2 as described above will be described in concentrate in connection with a flow chart in FIG. 4.

In a first step 401 the line input impedance $Z_{in}(f)$ is generated. The absolute value $|Z_{in}(f)|$ of the line input impedance is generated in a step 402. In a step 403 the mean value mValue according to equation (10) is generated and in a step 404 the decision value dValue according to equation (11) is generated. The threshold value thValue is decided in a step 405 for the actual telecommunication cable type in the line 2. The decision is based on the attenuation for the cable type. In a step 406 it is investigated if the decision value is bigger than the threshold value. In an alternative NO the procedure is stopped in a step 407. In an opposite alternative YES the procedure goes on in a step 408 with the selection of extreme values of the curve A1 for the absolute values of the line input impedance. The frequency distance is generated, alternatively as a mean value of a number of frequency distance values, see equations (4), (5) or (8). In a step 410 the line length value L is generated, see equations (6), (7) or (9).

In the description above the line input impedance $Z_{in}(f)$ for the line 2 is measured via the measurement device MD1. It is an advantage for a telecom operator if a conventional transceiver for communication purposes can be used instead of a special measurement device such as the device MD1. Below will be described how such a transceiver can be calibrated and used for the measurement of the line input impedance $Z_{in}(f)$ in a single-ended loop test SELT.

Figure 5:
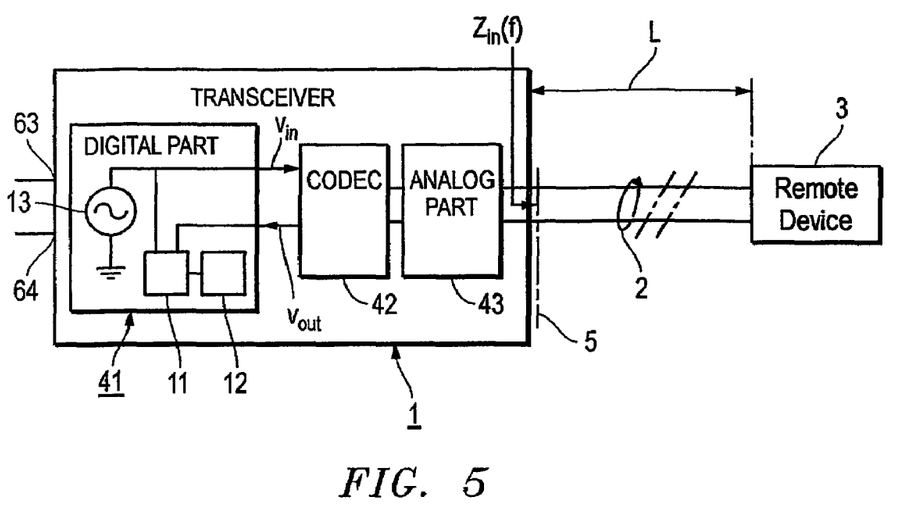
FIG. 5 shows a block schematic over a transceiver connected to a line.

In FIG. 5 is shown a front end device, in this case a transceiver 1, connected to the remote device 3 via the signal line 2. The transceiver is suitable for communication purposes and is described such that the SELT measurement can be explained. The transceiver 1 includes a digital part 41, a codec 42 and an analog part 43, the so called Analog Front End AFE. The digital part includes in turn a digital signal generator 13 and a computational device 11 interconnected with a memory device 12. The transceiver 1 also has an input 63 and an output 64. The generator, which is connected to the computational device 11, sends a broadband input loop test signal $v_{in}$ to the remote device 3 via the codec 42, the analog part 43 and the line 2. A reflected broadband loop test signal $v_{out}$ is received in the computational device from the line 2 via the analog part and the codec.

The broadband loop test signal $v_{in}$, sent for such measuring purposes, is reflected back over the line 2 and is noted as the loop test signal $v_{out}$. As will be described below, the signals $v_{in}$ and $v_{out}$ are used in the determining of the properties of the line 2.

What the operator in fact needs to know is the input impedance $Z_{in}(f)$ of the line 2 including the remote device 3, measured from a transceiver interface 5 and being independent of the transceiver 1 itself. A first step in getting the required line properties is to generate an echo transfer function $H_{echo}(f)$ for the actual line 2. This is calculated by performing a frequency translation of the broadband signals $v_{in}$ and $v_{out}$, resulting in signals $V_{in}(f)$ and $V_{out}(f)$ in the frequency domain. The transfer function is generated by the relationship $$H_{echo}(f) = V_{out}(f)/V_{in}(f) \tag{12}$$

in which the frequency is denoted by f.

Naturally, the function $H_{echo}(f)$ includes properties of the transceiver 1. Below it will be described by an example how the required line properties of the line 2 can be obtained with the aid of the frequency dependent echo transfer function $H_{echo}(f)$. First, the transceiver analog part 43 will be described somewhat more in detail in connection with FIG. 6. This is to throw light upon the difficulties in characterizing the transceiver 1 in a simple manner.

Figure 6:
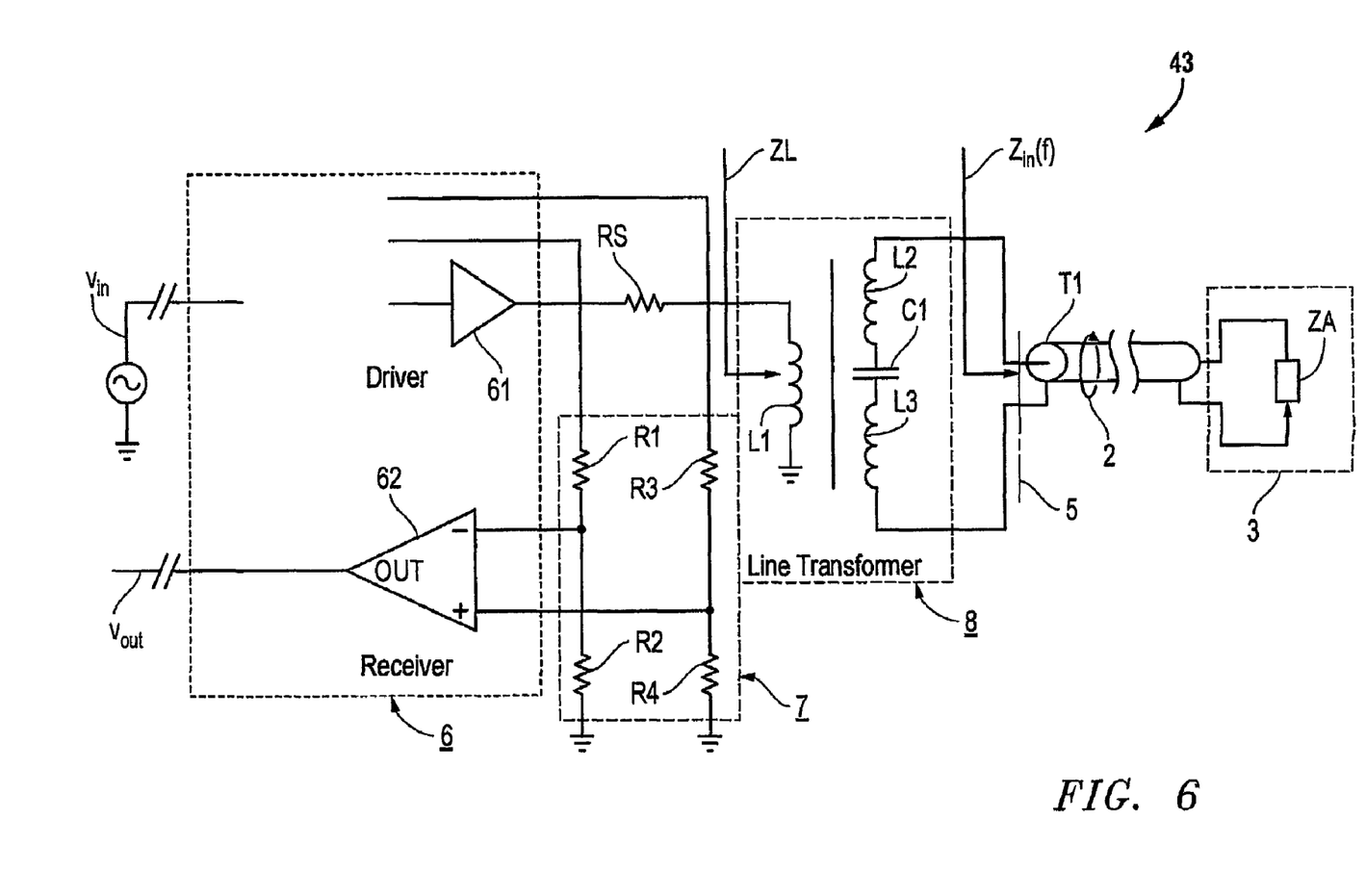
FIG. 6 shows a somewhat more detailed block schematic over a transceiver.

FIG. 6 is a simplified block diagram over the analog transceiver part 43 and the line 2 of FIG. 5, yet somewhat more detailed than in that figure. The analog part 43 includes an amplifier block 6, a hybrid block 7, a sense resistor RS and a line transformer 8. The amplifier block 6 has a driver 61 with its input connected to the digital generator 13 via the codec 42, not shown. I also has a receiver 62 receiving signals from the line 2 and having its output connected to the transceiver digital part 41, not shown. The driver output is connected to the sense resistor RS, the terminals of which are connected to the hybrid block 7. The latter has four resistors R1, R2, R3 and R4 and is connected to inputs of the receiver 62. The line transformer 8 has a primary winding L1 and two secondary windings L2 and L3 interconnected by a capacitor C1. The primary winding L1 is connected to the sense resistor RS and the secondary windings L2 and L3 are connected to the line 2. The frequency dependent line-input impedance at the interface 5 is denoted $Z_{in}(f)$ and the input impedance at the primary side of the transformer is denoted ZL. The termination of the far-end of the line 2, the remote device 3, is represented by an impedance ZA.

The signal $v_{in}$, now in analog form from the codec 42, is amplified in the driver block 61. The output impedance of the driver is synthezised by the feedback loop from the sense resistor RS. The line transformer 8 has a voltage step-up from the driver to the loop. The capacitor C1 has a DC-blocking function. The transformer and the capacitor act as a high pass filter between the driver 61/receiver 62 and the loop 2, 3 with a cut-off frequency around 30 kHz. No galvanic access to the loop is possible in this case.

In the present description a frequency-domain model of the echo transfer function $H_{echo}(f)$ is used to calculate the frequency dependent input impedance $Z_{in}(f)$ of the loop 2 and 3, as seen by the transceiver 1 at the interface 5. The input impedance can then be used for calculating several loop qualification parameters. This frequency-domain model of the echo transfer function $H_{echo}(f)$ includes three parameters $Z_{h0}(f)$, $Z_{hyb}(f)$ and $H_{\infty}(f)$ which relate to the transceiver 1. The parameters, transceiver model values, fully describe the transceiver from this point of view.

The parameters $Z_{h0}(f)$, $Z_{hyb}(f)$ and $H_{\infty}(f)$ are originally deduced analytically from the circuits of the transceiver. Some minor simplifications have been made in the analysis, but the model has proved to be very accurate.

The values of the parameters are normally not calculated directly from the component values of the transceiver, but are generated from measurements in a calibration process, as will be described below.

In the earlier mentioned standardization paper "How is G.selt to specify $S_{11}$ (calibrated measurements)?" the scattering parameter $S_{11}$ is expressed with three parameters C1, C2 and C3 for the transceiver. These parameters should not be confused with the transceiver model values $Z_{h0}(f)$, $Z_{hyb}(f)$ and $H_{\infty}(f)$ of the present description. The parameters C1, C2 and C3 are dimensionless quantities and are not given any concrete meaning, although they are successfully used to model the transceiver. The transceiver model values of the present description are recognized in the analysis and can be interpreted directly:

The value $H_{\infty}(f)$ is the frequency dependent echo transfer function for the transceiver 1 with open connection to the line 2, i.e. when the line impedance is of unlimited magnitude.

The value $Z_{hyb}(f)$ is the transceiver impedance as measured at the connections to the line 2, i.e. the transceiver impedance at the interface 5 as seen from the line side. The value $Z_{h0}(f)$ can be expressed as $Z_{h0}(f)=H_0(f) \cdot Z_{hyb}(f)$, in which the value $H_0(f)$ is the frequency dependent echo transfer function for the transceiver 1 with the connections to the line 2 shortcut and the value $Z_{hyb}(f)$ is defined above.

It is to observe that the transceiver model values are not measured directly, but are generated in a process as will be described below.

The echo transfer function $H_{echo}(f)$ of equation (1) can be expressed as:

$$H_{echo}(f) = \frac{H_{\infty}(f)Z_{in}(f) + Z_{h0}(f)}{Z_{in}(f) + Z_{hyb}(f)} \quad (13)$$

in which $Z_{in}(f)$ is the earlier mentioned input impedance of the line 2 as a function of the frequency f; and $Z_{h0}(f)$, $Z_{hyb}(f)$ and $H_{\infty}(f)$ are complex vectors and are the transceiver model values mentioned above.

After a calibration measurement of a certain transceiver version its vectors can be determined. These vectors, the transceiver model values, are then pre-stored in for example the software of the transceivers of the measured version, e.g. in the memory 12 of the transceiver 1. The model values are then used for the loop test of the line 2 with its initially unknown properties.

Figure 7:
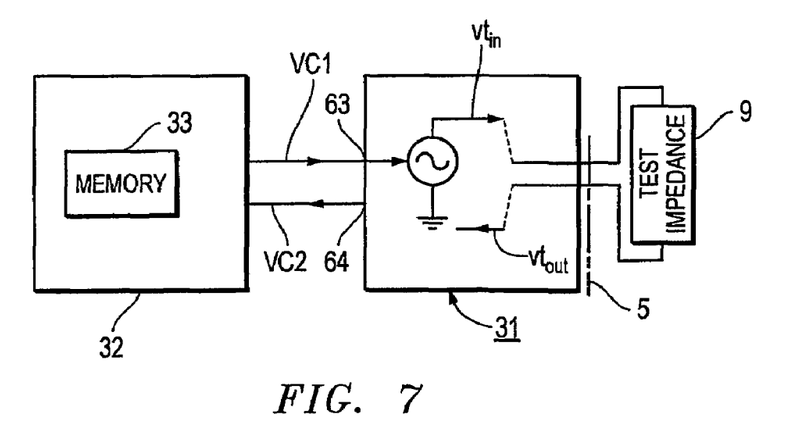
FIG. 7 shows a block schematic over a test transceiver connected to a test impedance.

In connection with FIG. 7 will be mentioned how the calibration measurement is performed. The figure shows a test transceiver 31, to which test impedances 9 of different predetermined values are connected at the interface 5 for the line 2. A measurement device 32 with a memory 33 is connected to the input 63 and the otput 64 of the test transceiver. The measurement device 32 sends a control signal VC1 to the test transceiver 31 and initiates it to generate a broadband transceiver test signal $vt_{in}$, one for each value of the test impedance 9. A reflected output transceiver test signal $vt_{out}$ is received in the test tranceiver, which sends a corresponding control signal VC2 to the measurement device. A complete measurement requires the measurement of three selected impedance values. The echo transfer function $H_{echo}(f)$ is then generated in accordance with the relationship (12).

Using three impedance values for the calibration is sufficient to generate the transceiver values. To get more precise values, more than the three impedances can be used. This gives rise to an overdetermined equation system. An example on a set of standard values of the test impedance 9 for the calibration is an open circuit, a shortcut circuit and an impedance value corresponding to an expected value for the loop, e.g. 100 ohms. It should be noted that a value for a purely resistive component is normally valid only up to a limited frequency, e.g. 1 MHz. For higher frequencies it is recommended to measure the impedance value of the "resistive" component.

The generation of the three complex vectors $Z_{h0}(f)$, $Z_{hyb}(f)$ and $H_{\infty}(f)$ for the measured transceiver 31 is performed in the following manner. The model of the echo transfer function in the relationship (13) can be expressed as:

$$(1 - H_{echo}(f)Z_{in}(f)) \begin{pmatrix} Z_{h0}(f) \\ Z_{hyb}(f) \\ H_{\infty}(f) \end{pmatrix} = H_{echo}(f)Z_{in}(f) \quad (14)$$

or equivalently Ax=b, where $$A = (1 - H_{echo}(f)Z_{in}(f)),$$

$$x = \begin{pmatrix} Z_{h0}(f) \\ Z_{hyb}(f) \\ H_{\infty}(f) \end{pmatrix} \text{ and}$$

$$b = H_{echo}(f)Z_{in}(f)$$

The general solution to the system Ax=b is $$x = (A^T A)^{-1} A^T b$$

By using the values of the transfer function $H_{echo}(f)$, measured as described above with different types of the input terminations 9, the vector x can be solved. The thus generated calibration values of the vector x are stored for example in the memory 33 of the measurement device 32 or in the memory 12 of the transceivers of the measured version. Note that A, x and b normally are complex valued and frequency dependent.

After a measurement of the echo transfer function $H_{echo}(f)$ for the actual unknown line 2, its input impedance as seen by the transceiver 1 at the interface 5 can be generated as:

$$Z_{in}(f) = \frac{Z_{h0}(f) - Z_{hyb}(f)H_{echo}(f)}{H_{echo}(f) - H_{\infty}(f)} \quad (15)$$

To summarize, a certain hardware for transceivers like the transceiver 1 is first calibrated. This is performed for the test transceiver 31 with the aid of the impedances 9 and the transceiver test signals $vt_{in}$ and $vt_{out}$. The vector x is calculated and the values of the vector x are stored and can be used for any transceiver with the same hardware. The echo transfer function $H_{echo}(f)$ is then measured by the transceiver 1 for the line 2 having unknown properties with the aid of the loop test signals $v_{in}$ and $v_{out}$. The frequency dependent input impedance $Z_{in}(f)$ of the line 2, as seen from the transceiver interface 5, is then generated.

In the embodiment described above, both the transceiver test signals $vt_{in}$, $vt_{out}$ and the loop test signals $v_{in}$, $v_{out}$ have been broadband signals. It is possible to use signals of any desired frequency width both for the calibration and the measurement of the line. The calibration and the loop test will of course be valid only for the selected frequency range. It has been mentioned that the transceiver model values are stored in the memory 12 of the transceiver 1. An obvious alternative is to store the values in the memory 33 or in a memory in some central computer and transmit them to the transceiver 1 when they are required for the generation of e.g. the input impedance $Z_{in}(f)$ of the line 2. Also, in the description has been mentioned the test transceiver 31 and the transceiver 1 for communication purposes. The test transceiver 31 can be any of a set of transceivers which are based on one and the same hardware. The test transceiver can in an obvious way be used for the communication purposes.

The above generation of transceiver model values and the generation of the impedance value for the line 2 will be shortly described in connection with flowcharts in FIGS. 8 and 9.

Figure 8:
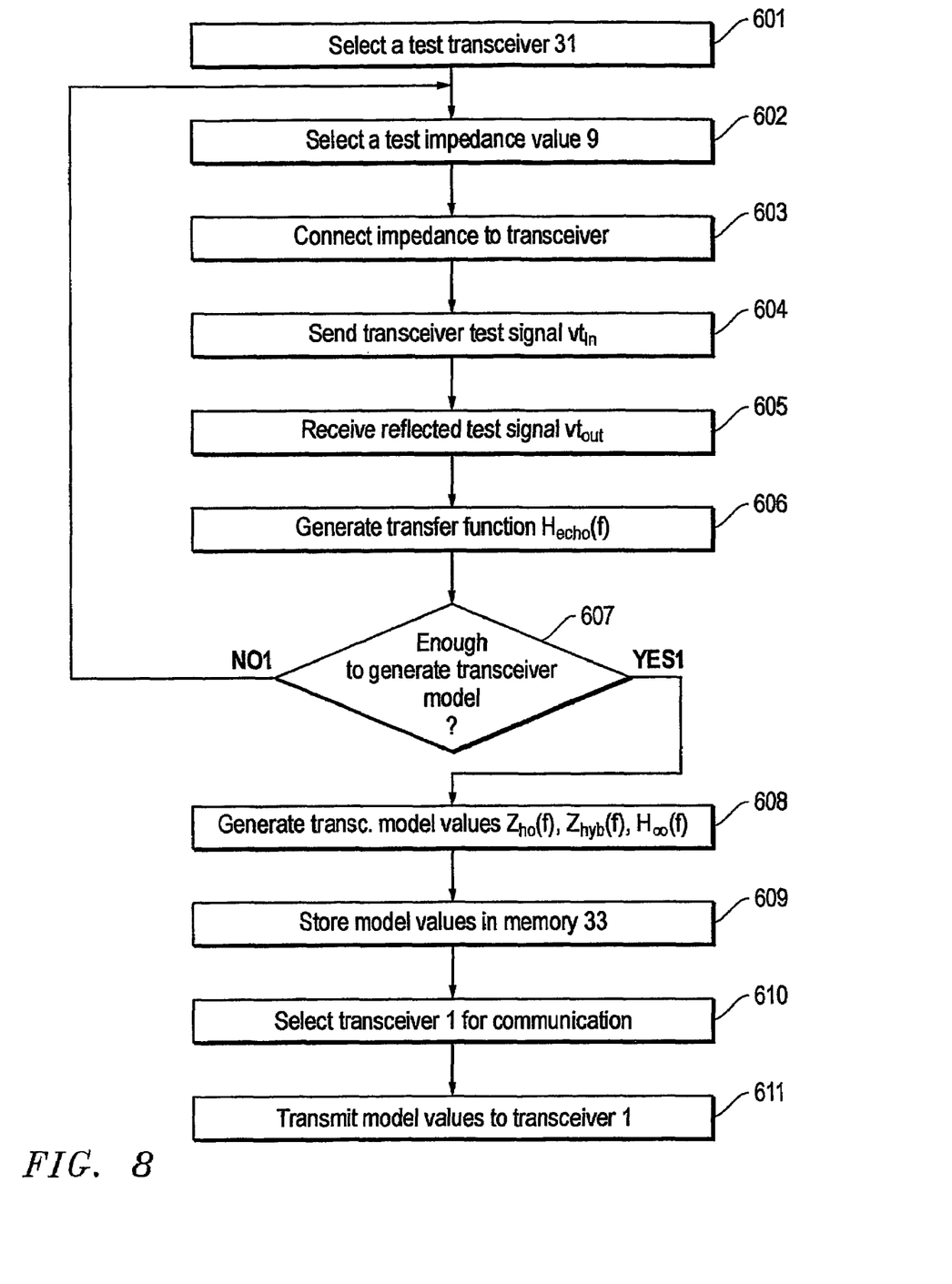
FIG. 8 shows a flow chart over a method of generating transceiver model values.

In FIG. 8 is shown the generation and storage of the transceiver model values. The method begins in a step 601 with the selection of the transceiver 31 for test purposes. In a step 602 an impedance 9 with a predetermined value is selected and in a step 603 the impedance is connected to the line connection of the test transceiver 31. In a step 604 the transceiver test signal $vt_{in}$ is sent through the transceiver 31 to the line 2. To get transceiver model values that can be used for a wide range of applications the test signal is a broadband signal. The signal is reflected by the remote device 3 and after passage of the transceiver 31 it is received as the transceiver test signal $vt_{out}$ in a step 605. In a step 606 the echo transfer function $H_{echo}(f)$ is generated in the computational device 32 for the actual impedance 9, after first having transformed the signals $vt_{in}$ and $vt_{out}$ into the frequency domain. In a step 607 it is investigated whether measurements for a sufficient number of the impedances 9 have been made, so that the transceiver model values $Z_{h0}(f)$, $Z_{hyb}(f)$ and $H_{\infty}(f)$ can be generated. In an alternative NO1 a further impedance 9 is selected in the step 602. For an alternative YES1 the transceiver model values $Z_{h0}(f)$, $Z_{hyb}(f)$ and $H_{\infty}(f)$ are generated in a step 608. In a step 609 the vector x, i.e. the transceiver model values, are stored in the memory 33. Next, the transceiver 1 for communication purposes is selected in a step 610. In a step 611 the transceiver model values $Z_{h0}(f)$, $Z_{hyb}(f)$ and $H_{\infty}(f)$ are transmitted to the selected transceiver 1 and are stored in the memory 12.

Figure 9:
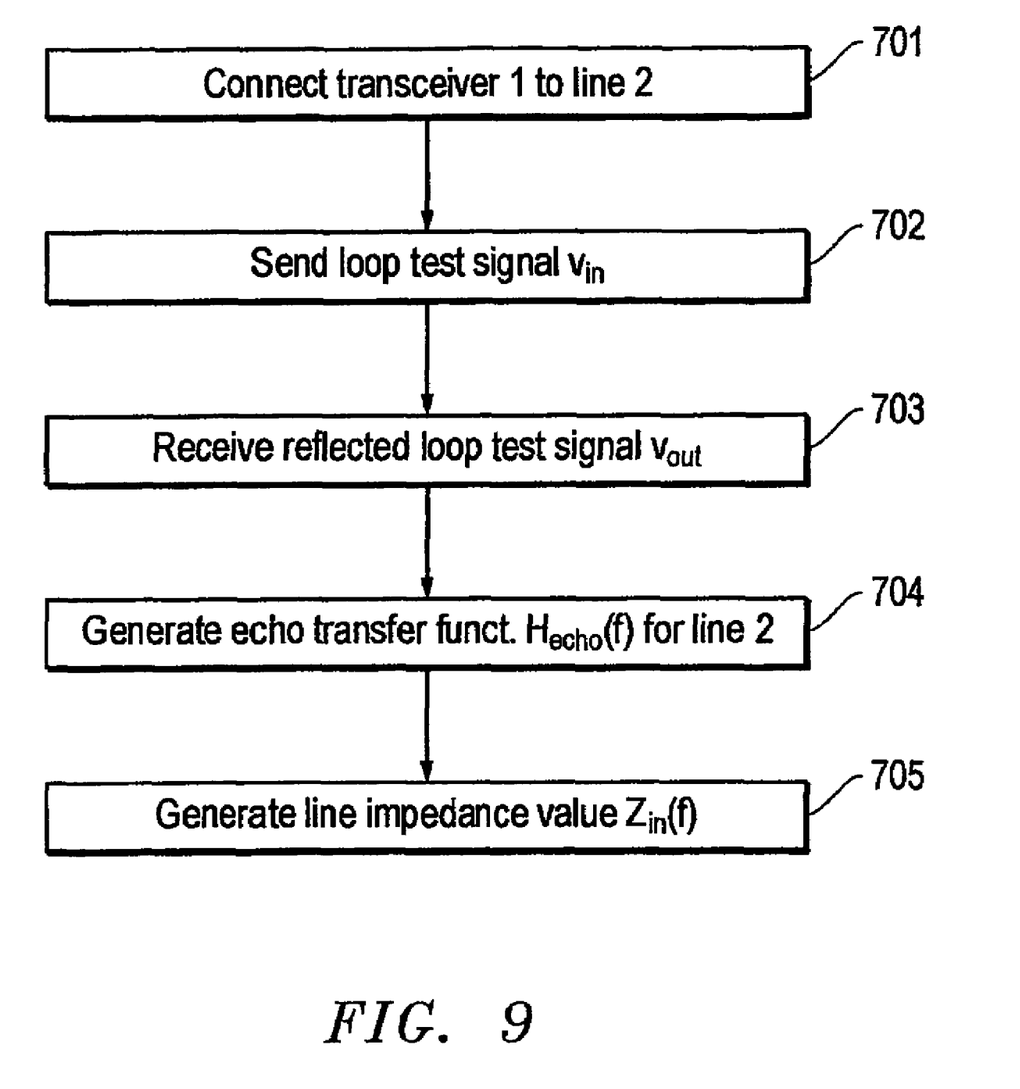
FIG. 9 shows a flow chart over a method of generating a line impedance value.

FIG. 9 shows the generation of the frequency dependent line input impedance $Z_{in}(f)$ at the transceiver interface 5 to the line 2. In a step 701 the transceiver 1 for communication purposes is connected to the line 2 with the remote device 3. The loop test signal $v_{in}$ is sent in a step 702. The loop test signal $v_{out}$ as reflected by the line 2 is received by the transceiver and is measured in a step 703. In a step 704 the frequency dependent echo transfer function $H_{echo}(f)$ is generated in the computational device 11. The frequency dependent impedance value $Z_{in}(f)$ for the line 2 is generated in the device 11 with the aid of the stored transceiver model values and the echo transfer function, step 705. This generating is performed in accordance with the relationship (15).

Figure 10:
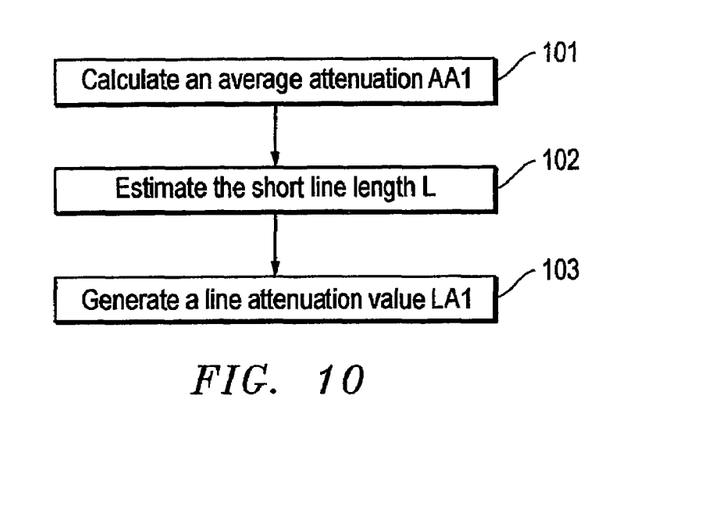
FIG. 10 shows a flow chart over a method of generating a line attenuation value.

An essential property of the signal line 2 is its signal attenuation. For lines that can be regarded as short this attenuation can be estimated in a simple manner with sufficient accuracy. A requirement for this is that the length L of the line is estimated with good accuracy, e.g. as described above. The method will be described in connection with a flow chart in FIG. 10. In a first step 101 an average attenuation value AA1 is calculated for a selected set of normally used telecommunication cables. An example on such an average value is AA1=11 dB per kilometer. The line length L of the actual short line is estimated with good accuracy in a step 102. In a step 103 a line attenuation value LA1 is generated by multiplying the line length L with the average attenuation value AA1. In an embodiment, with reference to FIG. 1, the method is performed by writing the average attenuation value AA1 via the control input/output IU1 and storing it in the calculation unit CU1. The line input impedance $Z_{in}(f)$ is calculated in accordance with equation (1) and the line length is estimated by calculations in the calculating unit CU1. In the same unit the line attenuation LA1 is generated.

Another possibility to estimate a value on the line attenuation would be to use the ratio between a minimum and an adjacent maximum value of the magnitude of the absolute impedance value $|Z_{in}(f)|$ the curve A1 in FIG. 3. The estimation is performed using an equation:

$$\text{loss} = \tanh^{-1}\left(\sqrt{\frac{|Z_{in,\min}|}{|Z_{in,\max}|}}\right) \quad (16)$$

As an example the minimum value Min1 and the adjacent maximum value Max1 are used, which gives:

$$\text{loss} = \tanh^{-1}\left(\sqrt{\frac{|\text{Min1}|}{|\text{Max1}|}}\right) \quad (17)$$

The value loss is the insertion loss value that the line 2 gives rise to when inserted between the transceiver 1 and the remote device 3 in FIG. 5.

The invention claimed is:

1. Method of generating line properties of a signal line including generating a frequency dependent line input impedance for a loop, the loop including the signal line and a remote device, the method being characterized by:

Generating an absolute value function from the frequency dependent line input impedance the function being essentially periodic;

Selecting at least two consecutive extreme values of the same type of the absolute value function Generating a frequency distance based on said at least two extreme values;

Generating a line length value based on the frequency distance and a velocity of propagation for a signal on the signal line.

2. Method of generating line properties of a signal line according to claim 1, wherein the frequency distance is a mean value between at least two different frequency distances each of which reaches between two consecutive ones of the extreme values of the same type.

3. Method of generating line properties of a signal line according to claim 1, the method being performed as a single ended loop test and including:

selecting a test transceiver suitable for communication purposes;

connecting, in a calibration process, at least three impedances of each a predetermined value to a signal line connection of the test transceiver;

generating frequency dependent echo transfer functions utilizing test signals and said at least three impedances; and generating transceiver model with the aid of said echo transfer functions and the corresponding impedance values, said model values including an echo transfer function for the test transceiver with open line connection, a transceiver impedance value as seen from the line side and a product of said transceiver impedance value and an echo transfer function for the transceiver with shortcut line connection.

4. Method of generating line properties of a signal line according to claim 3 including storing the transceiver model values obtained in the calibration process.

5. Method of generating line properties of a signal line according to claim 4 including:

selecting a transceiver for communication purposes of the same type of hardware as said test transceiver in the calibration process;

connecting the loop to the transceiver;

sending, via the connected transceiver, a loop test signal to the line;

measuring, via said transceiver, the loop test signal as reflected;

generating a loop echo transfer function for the loop;

generating the frequency dependent line input impedance value for the loop with the aid of the stored transceiver model values and the generated echo transfer function.

6. Method of generating line properties of a signal line according to claim 1, wherein a short loop length decision value is estimated, the method including:

generating, in a predetermined loop length frequency range, an impedance mean value of the absolute value of the line input impedance;

generating, in the loop length frequency range, the short loop length decision value base on the line input impedance and said impedance mean value;

comparing the short loop length decision value with a predetermined threshold value;

deciding the loop to be a short loop based on said comparison.

7. Method of generating line properties of a signal line according to claim 1, including:

calculate an average attenuation value for a selected set of telecommunication cables;

estimate the length of the short signal line;

generate an attenuation value for the line by multiplying the average attenuation value with the line length.

8. Method of generating line properties of a signal line according to claim 1, including:

selecting one of the minimum values of the absolute value function and an adjacent of the maximum values;

generating an insertion loss value for the line based on said minimum and maximum values.

9. An arrangement for generating line properties of a signal line, the arrangement including a front end device having connections for a loop including the signal line and a remote device, circuits in the front end device for generating a frequency dependent line input impedance for the loop, a calculation unit for generating an absolute value function from the frequency dependent line input impedance, the function being essentially periodic;

circuits in the calculation unit suitable for:

a). selecting at least two consecutive extreme values of the same type of the absolute value function;

b). generating a frequency distance based on said at least two extreme values;

c). generating a line length value based on the frequency distance and a velocity of propagation for a signal on the signal line.

10. An arrangement for generating line properties of a signal line according to claim 9, wherein the calculation unit is arranged for calculating a mean value between at least two different ones of the frequency distances, each of which reaches between two consecutive ones of the extreme values of the same type.

11. An arrangement for generating line properties of a signal line according to claim 9, wherein the front end device is a transceiver for communication purposes, the arrangement in a calibration mode including:

a test transceiver connected to a measurement device;

the measurement device being arranged to generate, in a calibration process, calibration values for the transceiver for communication purposes with the aid of at least three impedances and test signals the impedances having each a predetermined value and being connected to the line connection of the test transceiver;

the measurement device being arranged to generate a frequency dependent echo transfer function for the test transceiver connected to the respective one of the impedances;

the measurement device being arranged to generate transceiver model values with the aid of said echo transfer function and the corresponding impedance values, said model values including an echo transfer function for the transceiver with open line connection, a transceiver impedance value as seen from the line side and a product of said transceiver impedance value and an echo transfer function for the transceiver with shortcut line connection; and the transceiver for communication purposes being arranged to generate the frequency dependent line input impedance with the aid of the transceiver model values.

12. An arrangement for generating properties of a signal line according to claim 11, the arrangement including a memory for storing the transceiver model values.

* * * * *

UNITED STATES PATENT AND TRADEMARK OFFICE
CERTIFICATE OF CORRECTION

PATENT NO. : 7,362,850 B2 Page 1 of 1
APPLICATION NO. : 10/556657
DATED : April 22, 2008
INVENTOR(S) : Jensen et al.

It is certified that error appears in the above-identified patent and that said Letters Patent is hereby corrected as shown below:

On the Title Page, Item (57), under "ABSTRACT", in Column 2, Line 4, delete "$(Z_{in}(f))$" and insert -- $(Z_{in}(f))$, --, therefor.

In Column 1, Line 20, delete ""XDSL" and insert -- "xDSL --, therefor.

In Column 2, Line 42, delete "Talternative" and insert -- alternative --, therefor.

In Column 11, Line 55, in Claim 6, delete "base" and insert -- based --, therefor.

In Column 12, Line 5, in Claim 8, delete "1 ," and insert -- 1, --, therefor.

Signed and Sealed this

Twenty-eighth Day of October, 2008

JON W. DUDAS
*Director of the United States Patent and Trademark Office*

UNITED STATES PATENT AND TRADEMARK OFFICE
CERTIFICATE OF CORRECTION

PATENT NO. : 7,362,850 B2
APPLICATION NO. : 10/556657
DATED : April 22, 2008
INVENTOR(S) : Jensen et al.

It is certified that error appears in the above-identified patent and that said Letters Patent is hereby corrected as shown below:

On the title page item (57), under "ABSTRACT", in Column 2, Line 4, delete "($Z_{in}(f)$)" and insert -- ($Z_{in}(f)$), --, therefor.

In Column 1, Line 20, delete ""XDSL" and insert -- "xDSL --, therefor.

In Column 2, Line 42, delete "Talternative" and insert -- alternative --, therefor.

In Column 11, Line 55, in Claim 6, delete "base" and insert -- based --, therefor.

In Column 12, Line 5, in Claim 8, delete "1 ," and insert -- 1, --, therefor.

Signed and Sealed this

Eleventh Day of November, 2008

JON W. DUDAS
*Director of the United States Patent and Trademark Office*